US 6,745,373 B2

(12) United States Patent
Lackey

(10) Patent No.: US 6,745,373 B2
(45) Date of Patent: Jun. 1, 2004

(54) METHOD FOR INSERTION OF TEST POINTS INTO INTEGRATED CIRCUIT LOGIC DESIGNS

(75) Inventor: David E. Lackey, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 277 days.

(21) Appl. No.: 09/788,925

(22) Filed: Feb. 20, 2001

(65) Prior Publication Data

US 2002/0116690 A1 Aug. 22, 2002

(51) Int. Cl.[7] .............................. G06F 17/50; G06F 9/45
(52) U.S. Cl. .................................... 716/4; 716/2; 716/6
(58) Field of Search ................................. 716/4, 2, 6

(56) References Cited

U.S. PATENT DOCUMENTS

| | | |
|---|---|---|
| 5,208,178 A | 5/1993 | Usami |
| 5,231,314 A | 7/1993 | Andrews |
| 5,235,566 A | 8/1993 | Merrill |
| 5,369,643 A | 11/1994 | Rastgar et al. |
| 5,578,938 A | 11/1996 | Kazami |
| 5,799,021 A | 8/1998 | Gheewala |
| 5,838,692 A | 11/1998 | Tobin |
| 5,949,797 A | 9/1999 | Jung |
| 6,038,691 A | * 3/2000 | Nakao et al. ............... 714/733 |
| 6,092,224 A | 7/2000 | LeBlanc et al. |

OTHER PUBLICATIONS

M. Youssef et al., Methodology for Efficiently Inserting and Condensing Test Points, IEEE Proceedings, pp. 154–160, May 1993.*

Nakao et al., Low Overhead Test Point Insertion for Scan-Based BIST, ITC International Test Conference, pp. 348–357.

* cited by examiner

Primary Examiner—A. M. Thompson
(74) Attorney, Agent, or Firm—Schmeiser, Olsen & Watts; Robert A. Walsh

(57) ABSTRACT

A method of inserting test points in a circuit design includes selecting a node in the circuit design, determining a driver cell of the node, selecting a replacement cell for the driver cell and replacing the driver cell in the circuit design with the replacement cell. The replacement cell has the same function of the driver cell as well as a test point function. Additionally, the replacement cell is chosen so as not to break timing.

20 Claims, 5 Drawing Sheets

REPLACEMENT TABLE

| GATE IN LIBRARY (DRIVER CELL) | CONTROL TO 0 REPLACEMENT | CONTROL TO 1 REPLACEMENT | OBSERVE REPLACEMENT |
|---|---|---|---|
| OR2 | OA21 | OR3 | OR2 |
| AND2 | AND3 #1 | AO21 | AND2 |
| AND2 | AND3 #2 | | |
| COMPLEX | COMPLEX | COMPLEX | COMPLEX |

FIG. 8

METHOD FOR INSERTION OF TEST POINTS INTO INTEGRATED CIRCUIT LOGIC DESIGNS

FIELD OF THE INVENTION

The present invention relates to the field of testing integrated logic circuits and more specifically, it relates to methods for inserting test points into an integrated logic circuit for generating and observing faults in the integrated the logic circuit during test.

BACKGROUND OF THE INVENTION

The semiconductor industry has increasingly been able, by combination of increasing density and increasing die size, to fabricate dies with increasing numbers of logic circuits per die. This has, in turn, increased the number of combinational logic circuits that must be tested in order to assure that devices without faults are not shipped to consumers.

An important component in any test methodology is the step of generating the test data to apply to the combinational logic. Several concerns arise when generating the test data, including the number of test vectors and size of each test vector required for any given scan chain/combinational logic subset. Corollary concerns for physical testing include the amount of tester time required to execute each test vector and the amount of tester buffer memory consumed by the tests. Both these corollary concerns increase as the number of logic circuits per die increase and therefore increase the cost of testing.

The specific design and size of the combinational logic to be tested also directly affects the size of the test vector required. Ideally, the test vector is designed to test every path in the combinational logic. Some logic circuits are not completely testable, or even testable to acceptable levels of probability, without excessively large test vectors that would consume prohibitive amounts of tester resource. FIG. 1 illustrates an exemplary complex combinational logic function. Complex logic device 90 OR's sixteen inputs together to produce a single output. A vector of sixteen 0's is applied to the inputs of complex logic device 90 is required to produce a zero on the output the device. Therefore, any sixteen-bit test vector applied to the inputs of complex logic device 90 would have a $1/2^{16}$ probability of producing a 0 out. Thus $2^{16}$ test vectors are required to 100% test complex logic device 90.

One method of testing logic circuits used in the industry, incorporating placing scan in latches before and scan out latches after the logic circuits to be tested, will be used to illustrate the complexities of testing combinational logic circuits. It should be noted, however, that the following general discussion on testing combinational logic circuits as well as description of the present invention is not limited to scan latch testing but is applicable to other testing methods as well. One example of other testing methodologies is functional testing. In functional testing stimulus is applied to the logic primary inputs and then sequenced through the combinational logic and the internal sequential logic by pulsing the input clock while applying enabling values at the primary inputs. The overall sequence of the input stimuli and clock pulses is determined by test generation software or by human intervention.

FIG. 2 is a schematic diagram illustrating a scan latch circuit for testing a complex combinational logic circuit. Combinational logic circuit 100 includes a first circuit portion 105 coupled to a second circuit portion 110 through a node 115. Signals generated in first circuit portion 105 are applied to node 115 by a driver cell 120. While a single node 105 has been illustrated, additional nodes connecting first circuit portion 105 and second circuit portion 110 are not precluded. During test mode, test data (in the form of a test vector of 0's and 1's) is clocked from a data input pin 125 through scan in latches 130A, 130B, 130C and 130D, then through the combinational logic portions 105 and 110 to scan out latches 155A, 155B, 155C and 155D then to data output pin 140. Each scan in latch 130A, 130B, 130C and 130D has a normal and a test mode input. Each scan out latch 135A, 135B, 135C and 135D has a normal and a test mode output. The latches are "chained" by connecting the test mode inputs together and by connecting the test mode outputs together. During normal operation, the test clocks are held off, allowing the normal inputs on the scan in latches to be clocked through the combinational logic to the normal scan out latch outputs.

If combinational logic circuit 100 contains a very complex structure or if node 115 occurs in a logic path then the test vector that is needed to fully test the circuit or the signals at the node may be prohibitively large. In this case an approach to reducing test vector size is to insert control or observe functions into node 115 as illustrated in FIGS. 3 and 4 and described below. A test point is the node to be controlled or observed.

FIG. 3 is a schematic diagram illustrating the scan latch circuit of FIG. 1 with the addition of a control circuit. In this case a two input AND gate 150 has been inserted into node 115. The first input of AND gate 150 is coupled to control cell 120 and the output to second portion 110. The second input of AND gate 150 is coupled to the output of a two input OR gate 155. The first input of OR gate 155 is coupled to a test data latch 160 and the second input of the OR gate is coupled to an enable pin 165. Applying an enable signal to enable pin 165 causes any special test bit(s) applied to test data latch 160 to be combined with test data being driven onto node 115 by driver cell 120. Thus the special test bit(s) can force a value on test node 115 making diagnosis of the read out data on pin 140 easier and with a test vector of reduced size. FIG. 4 is a schematic diagram illustrating the scan latch circuit of FIG. 1 with the addition of an observe latch. In this case observe latch 170 is coupled to node 115. This allows the pattern on node 115 to directly read, again making diagnosis of the read out data on pin 140 easier and with a test vector of reduced size.

Both the methods illustrated in FIGS. 3 and 4 and described above suffer from the fact that introduction of a control circuit or observe point will change the delay of combinational logic circuit 100. Since logic circuit values must occur at specific times, introduction of significant delay can render diagnosis of read out data problematic. Further, since these control circuits and observe latches are permanently incorporated into combinational logic circuit 100 the normal mode (as opposed to test mode) performance of the circuit is adversely affected as well.

SUMMARY OF THE INVENTION

A first aspect of the present invention is a method of inserting a test point into a circuit design, comprising: selecting a node in said circuit design; determining a driver cell of the node; selecting from a file, a replacement cell for the driver cell, the replacement cell having the same function of the driver cell and a test point function; and replacing the driver cell in the circuit design with the replacement cell.

A second aspect of the present invention is a method of inserting a test point into a circuit design, comprising: selecting the test point to be inserted into the circuit design, the circuit design having signal propagation delay limits; determining a driver cell of the test point; selecting from a file, a replacement cell for the driver cell, the replacement cell having the same function of the driver cell and a test point function; determining the delay of the circuit design with the replacement cell; and replacing the driver cell with the replacement cell if the delay of the circuit design with the replacement cell is within the signal propagation delay limits.

A third aspect of the present invention is a method of inserting a test point into a circuit design, comprising: selecting a test point to be inserted into the circuit design, the circuit design having signal propagation delay limits; determining the driver cell of the test point; selecting from a file, all potential replacement cells for the driver cell, the potential replacement cells having the same function of the driver cell and a test point function; determining the delay of the circuit design with each of the potential replacement cells; adding to an accept list those replacement cells where the delay of the circuit design with the potential replacement cell is within the signal propagation delay limits; selecting a replacement cell from the accept list; and replacing the driver cell with the replacement cell.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 8 illustrates a replacement table from which replacement driver cells may be selected according to an embodiment of the present invention;

DETAILED DESCRIPTION OF THE INVENTION

Figure 5:
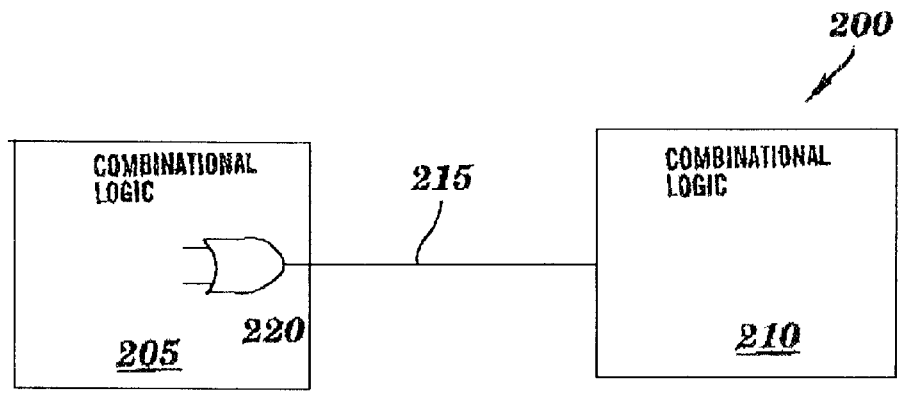
FIG. 5 is a schematic diagram illustrating a exemplary combinational logic circuit.

Referring to the drawings, FIG. 5 is a schematic diagram illustrating a exemplary combinational logic circuit. Combinational logic circuit 200 comprises a first circuit portion 205 and a second circuit portion 210. First circuit portion 205 and second circuit portion are coupled through node 215. Node 215 is driven by driver cell 220. Driver cell 220 is shown as an OR gate for illustrative purposes only. The problem presented is how to insert a test point into node 215 in order to reduce the size of the test vector needed to test combinational logic circuit 200.

Figure 6:
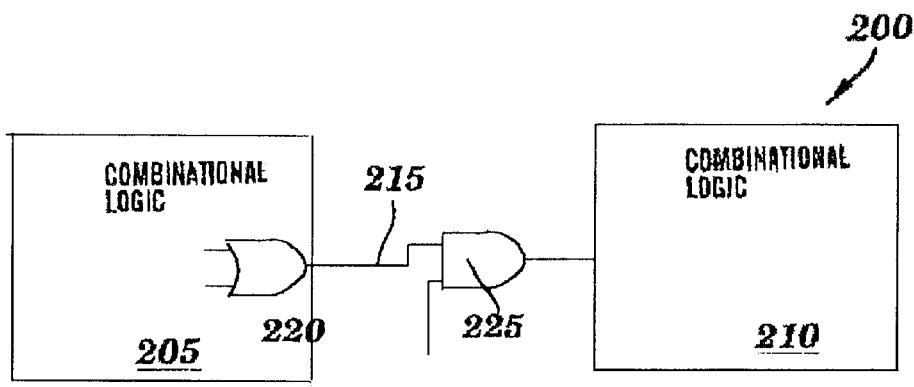
FIG. 6 is a schematic diagram illustrating the exemplary combinational logic circuit of FIG. 5 illustrating a prior method of inserting a test point.

FIG. 6 is a schematic diagram illustrating the exemplary combinational logic circuit of FIG. 5 illustrating a prior method of inserting a test point. Shown in FIG. 6 is a control device 225 inserted into node 215. For illustrative purposes control device is shown as an AND gate. As we know from previous discussion, while this method of inserting a control device into node 225 will allow for a reduction in test vector size, a delay has been added to combinational logic circuit 200. The problem now presented is how to introduce the function of control device 225 without introducing the attendant delay of the control device.

Figure 7:
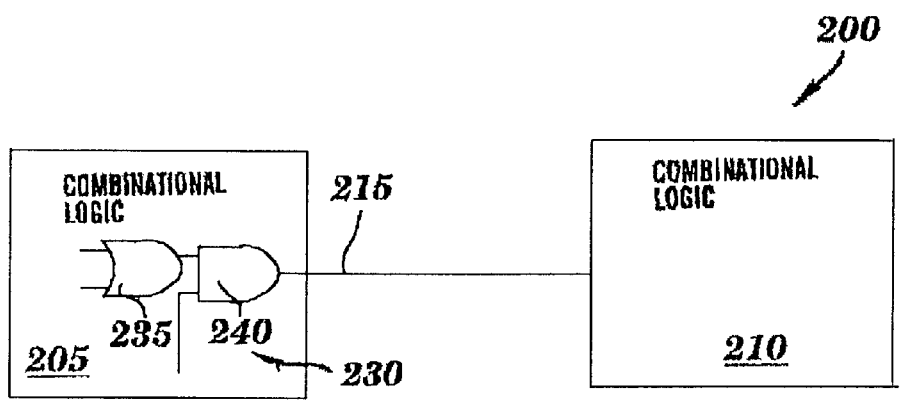
FIG. 7 is a schematic diagram illustrating the exemplary combinational logic circuit of FIG. 5 illustrating a method of inserting a test point according to the present invention.

FIG. 7 is a schematic diagram illustrating the exemplary combinational logic circuit of FIG. 5 illustrating a method of inserting a test point according to the present invention. As shown in FIG. 7, driver cell 220 has been replaced with a replacement driver cell 230. Replacement driver cell 230 comprises (again for illustrative purposes) an OR gate coupled to an AND gate, so the functions of driver cell 220 and control device 225 of FIG. 6 have been combined in replacement driver cell 230. Replacement driver cell is chosen to have the same or, within specified limits, nearly the same delay that is associated with driver cell 220 shown in FIG. 5. Specified limits are defined as the range of delay in which performance of combinational logic circuit 200 is within design specification.

FIG. 8 illustrates a replacement table from which replacement driver cells may be selected according to an embodiment of the present invention. The first column is a list of driver cells. Every cell design in the design library or a subset thereof is listed in the first column. The second column is the replacement cell for the driver cell of the first column, in the same row as the cell to be replaced, having the added function of control to 0. The replacement cell in the second column may be a standard design cell from the first column or a cell added to the design library for the purpose of being used as a replacement cell. There need not be a replacement cell in the second column in every row. The third column is the replacement cell for the driver cell of the first column, in the same row as the cell to be replaced, having the added function of control to 1. The replacement cell in the third column may be a standard design cell from the first column or a cell added to the design library for the purpose of being used as a replacement cell. There need not be a replacement cell in the third column in every row. The fourth column is the replacement cell for the driver cell of the first column, in the same row as the cell to be replaced, having the added function of observing the state of the node. The observe replacement cell is a cell specially added to the design library.

Figure 1:
FIG. 1 illustrates an exemplary complex combinational logic function.
Figure 2:
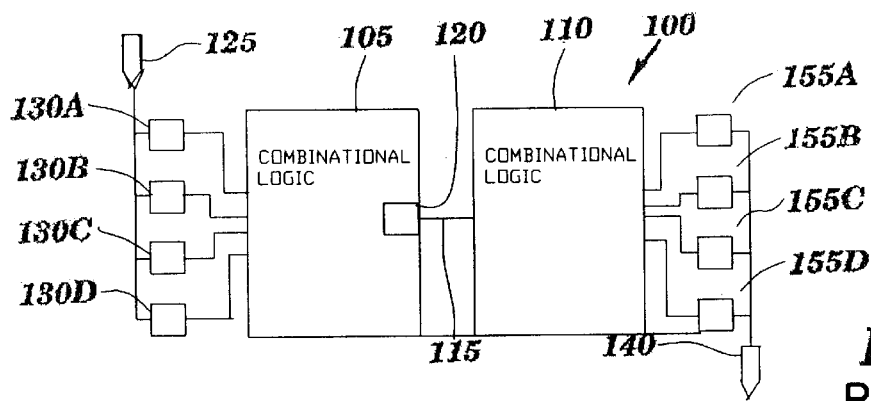
FIG. 2 is a schematic diagram illustrating a scan latch circuit for testing a complex combinational logic circuit.
Figure 3:
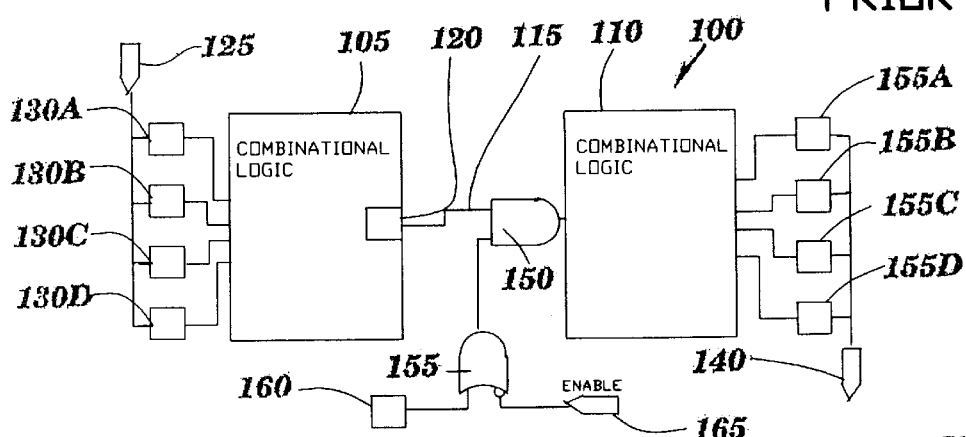
FIG. 3 is a schematic diagram illustrating the scan latch circuit of FIG. 1 with the addition of a control circuit.
Figure 4:
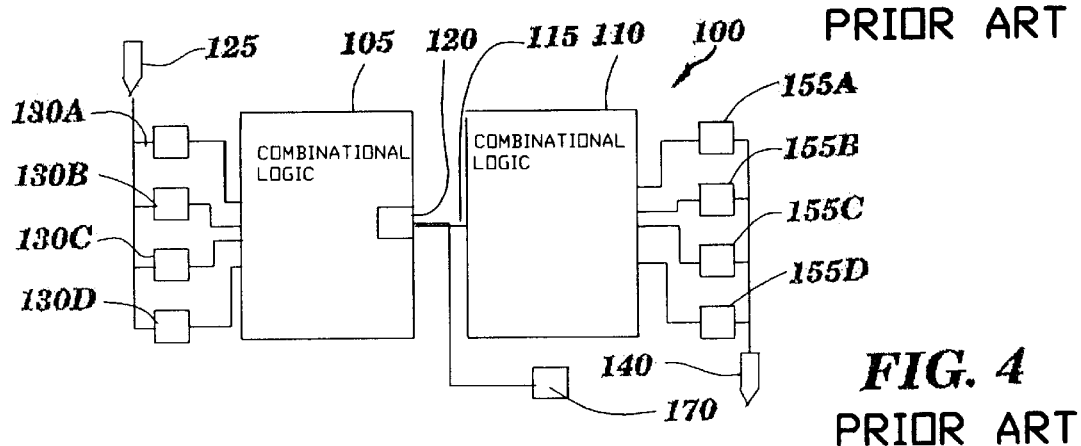
FIG. 4 is a schematic diagram illustrating the scan latch circuit of FIG. 1 with the addition of an observe latch.

Four illustrative rows are shown in the table. In the first row an OR function driver cell is illustrated. In the second row an AND function driver cell is illustrated. In the fourth row a complex function driver cell is illustrated. Combinational logic device 90 of FIG. 1 is an example of a complex function driver cell. It is also possible to have multiple rows of replacement cells having the same function but different signal propagation delays (here after referred to as delays). The third row of the table is an example. The difference between the replacement cells of the third row and the second row is the delay of the replacement cells.

Actual cell design data and delay data may not be contained within the replacement table. The replacement table may contain pointers to the actual data in other files, for example the design library. In one example, the delay of each cell in the replacement table is contained within the replacement table. In another example, the delay of each cell is contained in another file, for example, the design library, and the replacement table contains pointers to the delay values in the design library.

Figure 9:
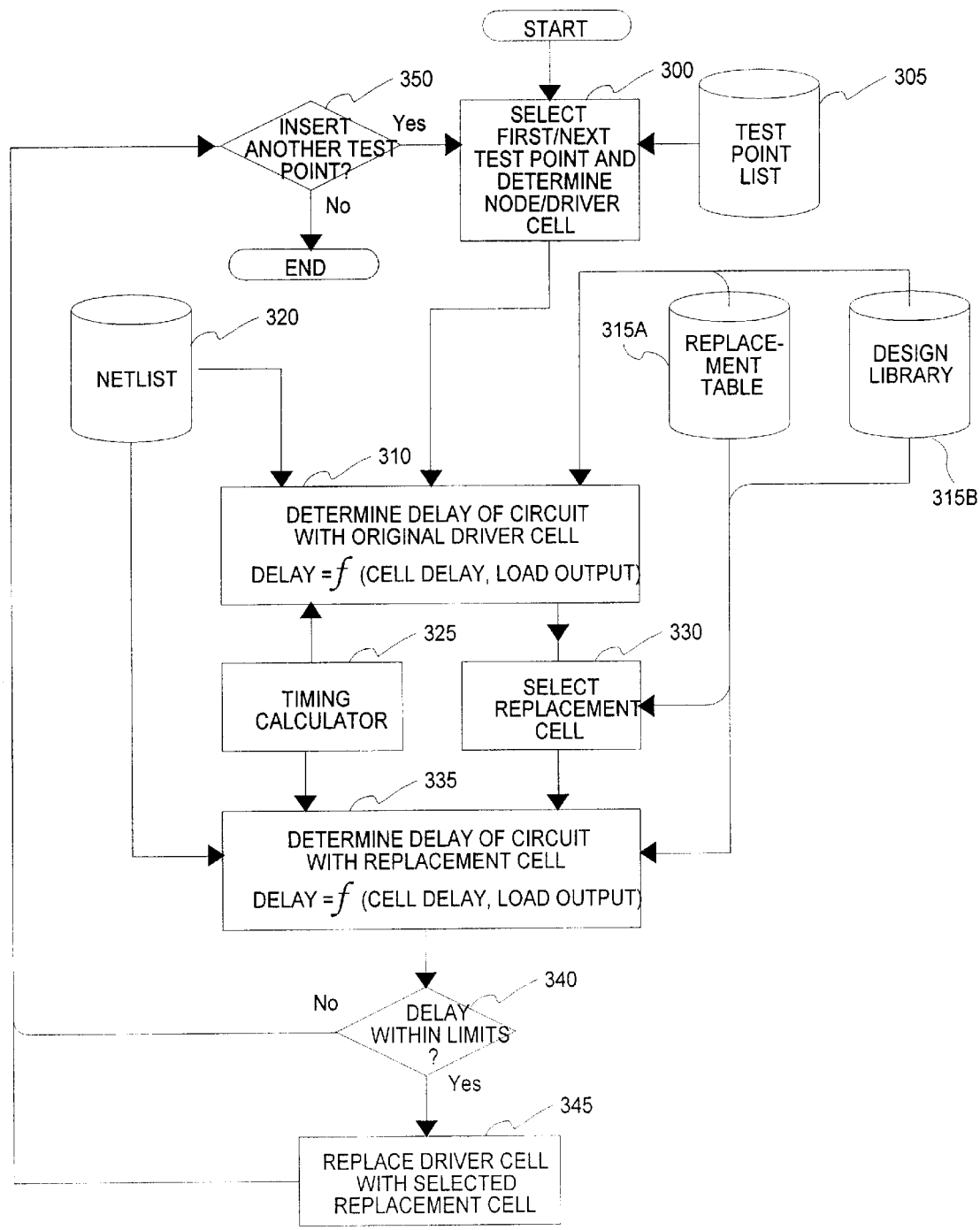
FIG. 9 is a flowchart illustrating the method steps for inserting test points into a logic circuit design according to the present invention.
Figure 10:
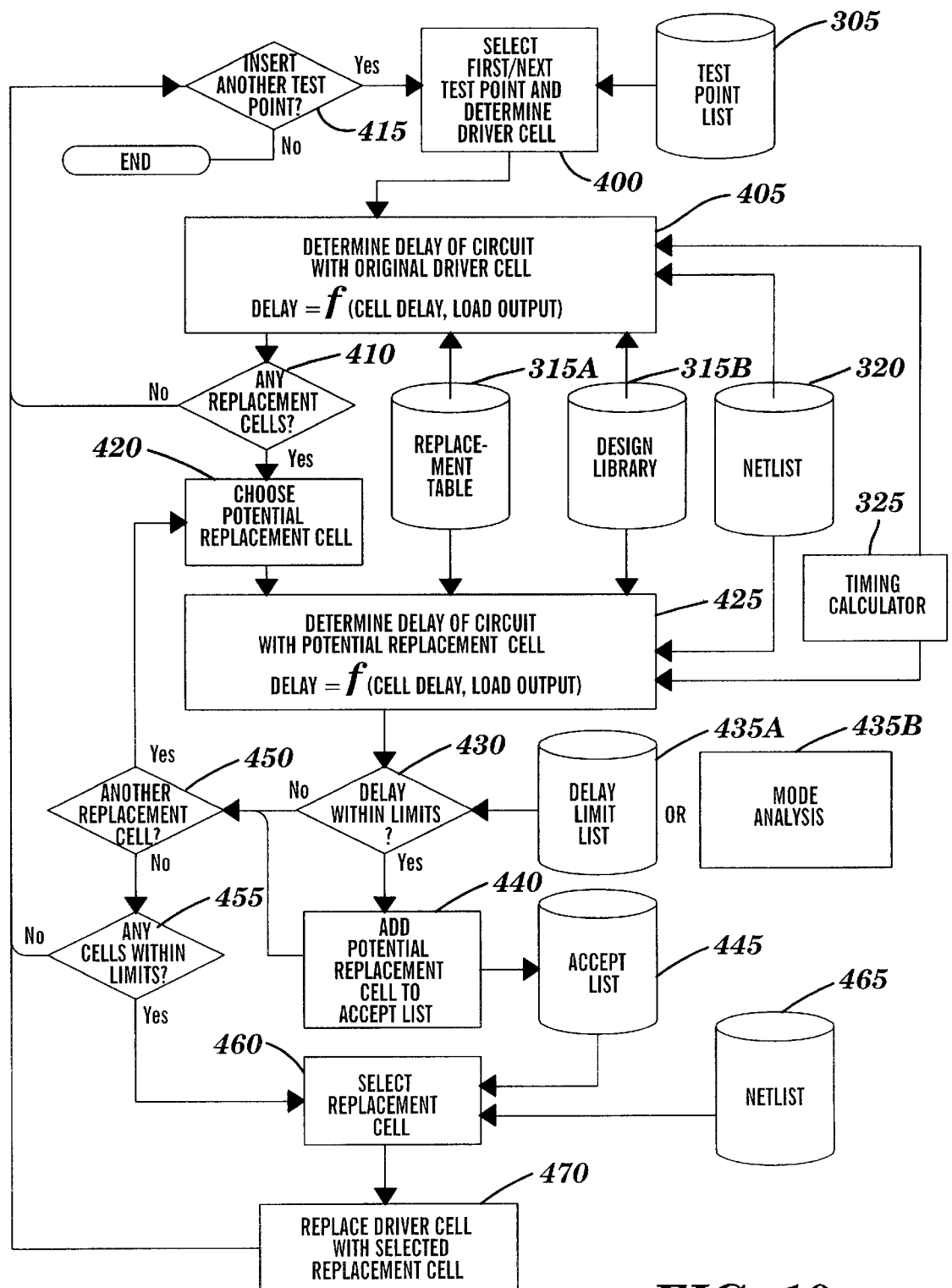
FIG. 10 is a flowchart illustrating the method steps of an alternative methodology for inserting test points into a logic circuit design according to the present invention.

FIGS. 9 and 10 illustrate the method steps for selecting and inserting replacement cells in a logic circuit design. Turning to FIG. 9, in step 300, the first/next test point to be inserted is selected from a test point list 305. Test point list 305 is a sub-set of the set of faults generated by typical test generation software that are either untestable or are not tested because of test equipment restraints or test time economics. Test point list 305 is generated either by a special test pattern generation containing this function or by human intervention. Test point list 305 contains control to zero and control to one test points, sorted in the order of most faults covered to least faults covered. Also in step 300, the driver cell to be replaced with a replacement cell (new driver cell/control cell combination) is determined.

In step 310, an original delay of the circuit with the original driver cell is determined. The original delay of the circuit is a function of the driver cell delay and the load output of the driver cell. The original delay of the cell is obtained from a replacement table 315A and from a design library 315B. Replacement table 315A has been illustrated in FIG. 8 and described above. Design library 315B contains the logic cell function, the delay of the function from each input pin to each output and the input pin capacitance pin over a range of operating conditions. The load output on the original driver cell is obtained from a netlist 320. The original delay is calculated using the driver cell delay and the driver cell load output as inputs to a timing calculator 325. Timing calculator 325 is usually contained within the cell insertion portion of the synthesis software used to create the circuit design, though a standalone version may be used.

In step 330, a replacement cell is selected from replacement table 315A. It is assumed that there is one, and only one, replacement cell for each driver cell in replacement cell table 315A. The situation where none or more than one replacement cell exists for a driver cell is illustrated in FIG. 10 and described below.

In step 335, the replacement delay of the circuit with the replacement cell is determined. The replacement delay of the circuit is a function of the replacement cell delay and the load output of the replacement cell. The delay of the replacement cell is obtained from replacement table 315A or alternatively from a design library 315B. The load output on the replacement cell is obtained from netlist 320. The replacement delay is calculated using the replacement cell delay and the replacement cell load output as inputs to timing calculator 325.

In step 340 it is determined if the delay of the circuit with the replacement cell is within delay limits of the circuit. Too little delay may be as detrimental to circuit performance as too much delay, depending on the individual circuit. One method of determining if the delay of the circuit with the replacement cell is acceptable is to apply a range to the delay of the circuit with the driver cell to create a delay limit and then compare the delay of the circuit with the replacement cell to this delay limit. If the delay of the circuit with the replacement cell is within delay limits, then in step 345 the original driver cell in the circuit design is replaced with the selected replacement cell and the method proceeds to step 350. If in step 345, the delay of the circuit with the replacement cell exceeds performance limits the method proceeds to step 350.

In step 350, it is determined if there is another test point to insert. If there is another test point to insert then the method proceeds to step 300, otherwise the method terminates and the circuit design with replacement cells is complete.

FIG. 10 is a flowchart illustrating the method steps of an alternative methodology for inserting test points into a logic circuit design according to the present invention. In step 400, the first/next test point to be inserted is selected from test point list 305. Also in step 400, the driver cell to be replaced with a replacement cell (new driver cell/control cell combination) is determined.

In step 405, an original delay of the circuit with the original driver cell is determined. The original delay of the circuit is a function of the driver cell delay and the load output of the driver cell. The original delay of the cell is obtained from replacement table 315A and from design library 315B. The load output on the driver cell is obtained from a netlist 320. The original delay is calculated using the driver original cell delay and the driver cell load output as inputs to timing calculator 325. Timing calculator 325 is usually contained within the cell insertion portion of the synthesis software used to create the circuit design, though a standalone version may be used.

In step 410, it is determined if potential replacement cells are available for the original driver cell. If in step 410, it is determined that no potential replacement cells are available then the method proceeds to step 415, otherwise the method proceeds to step 420. In step 420, a potential replacement cell is selected from replacement table 315A. Then, in step 425, the replacement delay of the circuit with the potential replacement cell is determined. The replacement delay of the circuit is a function of the potential replacement cell delay and the load output of the potential replacement cell. The delay of the potential replacement cell is obtained from replacement table 315A or alternatively from a design library 315B. The load output on the potential replacement cell is obtained from netlist 320. The potential replacement delay is calculated using the replacement cell delay and the replacement cell load output as inputs to timing calculator 325.

In step 430 it is determined if the delay of the circuit with the potential replacement cell is within delay limits of the circuit by examining a delay limit list 435A or alternatively doing a mode analysis 435B. Delay limit list 435A contains both fast and slow limits. The limits are set to minimize the change in the design's overall timing performance in terms of increased and decreased delay with the objective of eliminating the need to make further design changes caused by the insertion of the test point itself. Mode analysis performs both a late mode analysis and a early mode analysis. In late mode analysis data launched from a first latch clocked by a first clock arrives a second latch (destination latch) prior to capture by a subsequent first clock signal or by a second clock signal. In early mode analysis data launched from a first latch clocked by a first clock arrives a second latch (destination latch) after capture by a concurrent first clock signal or prior second clock signal.

If the delay of the circuit with the potential replacement cell is within delay limits, then in step 440 the potential replacement cell is added to an accept list 445. Then, in step 450, it is determined if there is another potential replacement cell for the current original driver cell. If in step 450, it is determined that there is another potential replacement cell available the method proceeds back to step 420. If in step 450, it is determined that there is not another potential replacement cell then the method proceeds to step 455.

In step 455, it is determined if there any replacement cells were found having a delay within the delay limit of the current circuit (are there replacement cells for the current driver cell listed in the accept list). If in step 455, it is determined that one or more replacement cells were found to be within delay limits the method proceeds to step 460. If in step 450, it is determined that no replacement cells with delays within the delay limit of the current circuit were found then the original cell is left in place, an exception is generated and the method proceeds to step 415.

In step 460, a replacement cell is selected from the potential replacement cells listed in accept list 445. Of course, if there is only one potential replacement cell in accept list 445, then that is the potential replacement cell selected. If, however, there is more than one potential replacement cell in accept list 445, there are several alternative methods of selecting the replacement cell. A first alternative method is to select the potential replacement cell having a delay range closest to the delay range of the current circuit. A second alternative method of selecting the replacement cell is to select the potential replacement cell having the smallest layout area. The layout area is obtained from synthesis library 465. A third alternative method of selecting the replacement cell is to select the potential replacement cell having the smallest power requirement. The power requirement is obtained from synthesis library 465. A fourth alternative method of selecting the replacement cell is to select the potential replacement cell that best fits a user defined algorithm for combining power requirements and layout area.

After the replacement cell is selected in step 460, then in step 470 the original driver cell in the circuit design is replaced with the selected replacement cell and the method proceeds to step 415. In step 415, it is determined if there is another test point to insert. If there is another test point to insert then the method proceeds to step 400, otherwise the method terminates and the circuit design with replacement cells is complete.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A method of inserting a test point into a circuit design, comprising:
   selecting a test point to be inserted into said circuit design, said circuit design having signal propagation delay limits;
   determining a driver cell of the test point;
   selecting from a file, all potential replacement cells for said driver cell, said potential replacement cells having the same function of said driver cell and a test point function;
   determining a delay of said circuit design with each of said potential replacement cells;
   adding to an accept list those potential replacement cells where the delay of said circuit design with said potential replacement cell is within said signal propagation delay limits;
   selecting a replacement cell from said accept list;
   replacing said driver cell with said replacement cell; and
   wherein the step of selecting a replacement cell from said accept list comprises selecting the potential replacement cell having a smallest power requirement of all potential replacement cells in said accept list.

2. The method of claim 1, further including:
   determining the delay of said circuit design with said driver cell; and
   applying a predetermined range to the delay of said circuit design with said driver to create said signal propagation limits.

3. The method of claim 1, further including the step of:
   performing an early and a late mode analysis of said circuit design with said driver cell to determine said signal propagation delay limits.

4. The method of claim 1, wherein said test point function of said potential replacement cell is a control to zero, control to one or observe function.

5. The method of claim 4, wherein said file is a replacement table.

6. The method of claim 5, wherein said file is a design library used to create said circuit design.

7. The method of claim 6, wherein said replacement table comprises:
   a list of driver cells comprised of at least a portion of gates in the design library used to create said circuit design;
   a combination of each of said gates in said list of driver cells and a control to zero function;
   a combination of each of said gates in said list of driver cells and a control to one function; and
   a combination of each of said gates in said list of driver cells and an observe function.

8. The method of claim 7, wherein said replacement table further comprises additional gates in said design library including:
   one or more combinations of said additional and a control to zero function;
   one or more combinations of said additional and a control to one function; and
   one or more combinations of said additional and an observe function.

9. The method of claim 1, wherein the step of selecting a replacement cell from said accept list further comprises selecting the potential replacement cell that will result in a circuit delay closest to the delay of the circuit design using the driver cell to be replaced.

10. The method of claim 1, wherein the step of selecting a replacement cell from said accept list further comprises selecting the potential replacement cell having a smallest layout area of all potential replacement cells in said accept list.

11. A method of inserting a test point into a circuit design, comprising:
   selecting a test point to be inserted into said circuit design, said circuit design having signal propagation delay limits;
   determining a driver cell of the test point;
   selecting from a file, all potential replacement cells for said driver cell, said potential replacement cells having the same function of said driver cell and a test point function;

determining a delay of said circuit design with each of said potential replacement cells;

adding to an accept list those potential replacement cells where the delay of said circuit design with said potential replacement cell is within said signal propagation delay limits;

selecting a replacement cell from said accept list;

replacing said driver cell with said replacement cell; and wherein the step of selecting a replacement cell from said accept list comprises selecting the potential replacement cell according to a user defined algorithm for combining a layout area and a power requirement of the potential replacement cell.

12. The method of claim 11, further including:

determining the delay of said circuit design with said driver cell; and applying a predetermined range to the delay of said circuit design with said driver to create said signal propagation limits.

13. The method of claim 11, further including the step of:

performing an early and a late mode analysis of said circuit design with said driver cell to determine said signal propagation delay limits.

14. The method of claim 11, wherein said test point function of said potential replacement cell is a control to zero, control to one or observe function.

15. The method of claim 14, wherein said file is a replacement table.

16. The method of claim 15, wherein said file is a design library used to create said circuit design.

17. The method of claim 16, wherein said replacement table comprises:

a list of driver cells comprised of at least a portion of gates in the design library used to create said circuit design;

a combination of each of said gates in said list of driver cells and a control to zero function;

a combination of each of said gates in said list of driver cells and a control to one function; and a combination of each of said gates in said list of driver cells and an observe function.

18. The method of claim 17, wherein said replacement table further comprises additional gates in said design library including:

one or more combinations of said additional gates and a control to zero function;

one or more combinations of said additional gates and a control to one function; and one or more combinations of a said additional gates and an observe function.

19. The method of claim 11, wherein the step of selecting a replacement cell from said accept list further comprises selecting the potential replacement cell that will result in a circuit delay closest to the delay of the circuit design using the driver cell to be replaced.

20. The method of claim 11, wherein the step of selecting a replacement cell from said accept list further comprises selecting the potential replacement cell having a smallest layout area of all potential replacement cells in said accept list.

* * * * *